(12) United States Patent
Weber et al.

(10) Patent No.: US 6,959,753 B1
(45) Date of Patent: Nov. 1, 2005

(54) CONSTRUCTION OF PHASE CHANGE MATERIAL EMBEDDED ELECTRONIC CIRCUIT BOARDS AND ELECTRONIC CIRCUIT BOARD ASSEMBLIES USING POROUS AND FIBROUS MEDIA

(75) Inventors: Richard M. Weber, Prosper, TX (US); Kerrin A. Rummel, Richardson, TX (US)

(73) Assignee: Raytheon Company, Waltham, MA (US)

( * ) Notice: Subject to any disclaimer, the term of this patent is extended or adjusted under 35 U.S.C. 154(b) by 1028 days.

(21) Appl. No.: 08/675,280

(22) Filed: Jul. 1, 1996

Related U.S. Application Data

(62) Division of application No. 08/406,226, filed on Mar. 17, 1995, now abandoned.

(51) Int. Cl.⁷ .............................................. F28D 15/00
(52) U.S. Cl. ............ 165/154.17; 165/185; 165/104.17; 165/901; 165/902; 165/905; 165/907; 165/DIG. 42
(58) Field of Search ................................ 165/907, 905, 165/DIG. 42, 10, 185, 902, 901

(56) References Cited

U.S. PATENT DOCUMENTS

| | | | | |
|---|---|---|---|---|
| 2,677,367 A | * | 5/1954 | Telkes ..................... | 165/902 X |
| 3,132,688 A | * | 5/1964 | Nowak ..................... | 165/902 X |
| 4,047,198 A | | 9/1977 | Sekhon et al. | |
| 4,057,101 A | * | 11/1977 | Ruka et al. .................. | 165/902 |
| 4,178,727 A | * | 12/1979 | Prusinski et al. ........ | 165/902 X |
| 4,268,558 A | * | 5/1981 | Boardman ................. | 165/10 X |
| 4,341,262 A | * | 7/1982 | Alspaugh ................... | 165/10 X |
| 4,381,818 A | * | 5/1983 | Sachar et al. ........... | 165/907 X |
| 4,408,659 A | * | 10/1983 | Hermanns et al. ............... | 165/DIG. 42 X |
| 4,446,916 A | * | 5/1984 | Hayes ...................... | 165/10 X |
| 4,512,388 A | * | 4/1985 | Claar et al. ............... | 165/10 X |
| 4,528,208 A | * | 7/1985 | Hirvonen et al. ....... | 165/902 X |
| 4,823,863 A | * | 4/1989 | Nakajima et al. ........ | 165/907 X |
| 4,832,118 A | * | 5/1989 | Scanlon et al. ............. | 165/164 |
| 4,898,234 A | * | 2/1990 | McGovern et al. ..... | 165/907 X |

(Continued)

FOREIGN PATENT DOCUMENTS

EP 0541456 A1 10/1992

(Continued)

OTHER PUBLICATIONS

Rosenbaum et al., Efficient and Simple Heat Exchangers, 1981, pp. 593-594.*

Primary Examiner—David A. Scherbel
(74) Attorney, Agent, or Firm—Baker Botts L.L.P.

(57) ABSTRACT

A heat sink which comprises an enclosure having a highly thermally conductive surface region and defining an enclosed cavity. A porous, highly thermally conductive material is disposed in the cavity, preferably homogeneously therein, and is thermally coupled to the thermally conductive surface. A phase change material changing from its initial phase, generally solid, to its final phase, generally liquid, responsive to the absorption of heat is disposed in the enclosed cavity and in the porous material. In accordance with a first embodiment, the highly thermally conductive surface region is preferably aluminum and the porous medium is a highly thermally conductive porous medium, preferably aluminum. In accordance with a second embodiment, the thermally conductive surface is composed of highly thermally conductive fibers disposed in a matrix and the porous material is a plurality of the thermally conductive fibers extending from the thermally conductive surface into the cavity. The highly thermally conductive fibers are preferably graphite and the matrix is preferably an epoxy.

17 Claims, 1 Drawing Sheet

U.S. PATENT DOCUMENTS

| | | | |
|---|---|---|---|
| 4,966,226 A | | 10/1990 | Hamburgen |
| 5,007,478 A | * | 4/1991 | Sengupta ................ 165/902 X |
| 5,039,577 A | * | 8/1991 | Knoell et al. ........... 428/650 X |
| 5,123,982 A | * | 6/1992 | Kuzay ................... 165/907 X |
| 5,225,964 A | * | 7/1993 | Nemes .................. 165/907 X |
| 5,267,611 A | * | 12/1993 | Rosenfeld ............... 165/907 X |
| 5,325,913 A | | 7/1994 | Altoz |
| 5,390,734 A | * | 2/1995 | Voorhes et al. ............. 165/185 |
| 5,404,272 A | * | 4/1995 | Lebailly et al. ......... 165/907 X |
| 5,852,548 A | * | 12/1998 | Koon et al. ............. 165/185 X |

FOREIGN PATENT DOCUMENTS

| | | | | |
|---|---|---|---|---|
| JP | 0096892 | * | 7/1980 | ................ 165/907 |
| JP | 0232496 | * | 11/1985 | ................ 165/907 |
| JP | 63-267890 | | 11/1988 | |
| JP | 0147294 | * | 6/1989 | ................ 165/907 |
| JP | 0208497 | * | 8/1990 | ................ 165/907 |
| JP | 4-44352 | | 2/1992 | |
| JP | 4143526 | * | 5/1992 | ................ 165/907 |
| JP | 406034287 | * | 2/1994 | ................ 165/902 |
| JP | 6-291480 | | 10/1994 | |

* cited by examiner

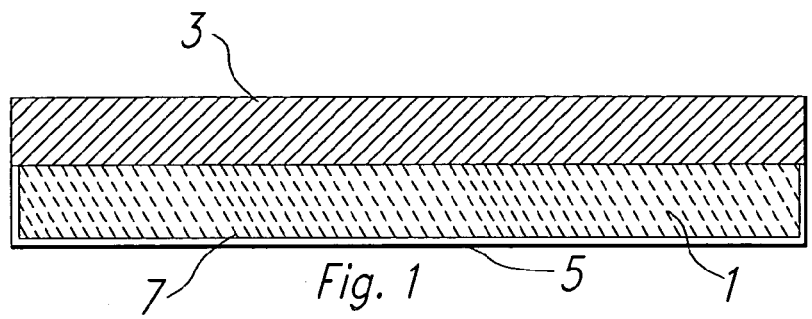
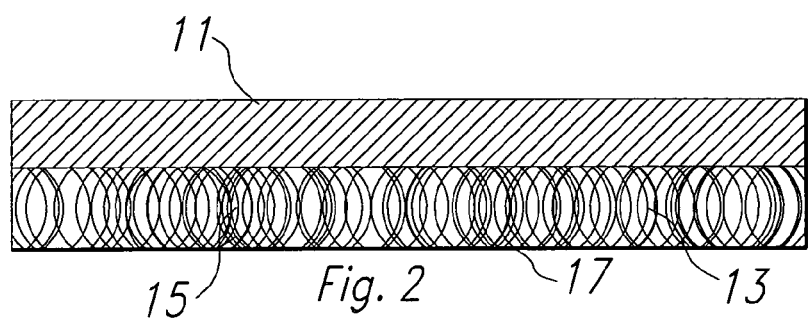
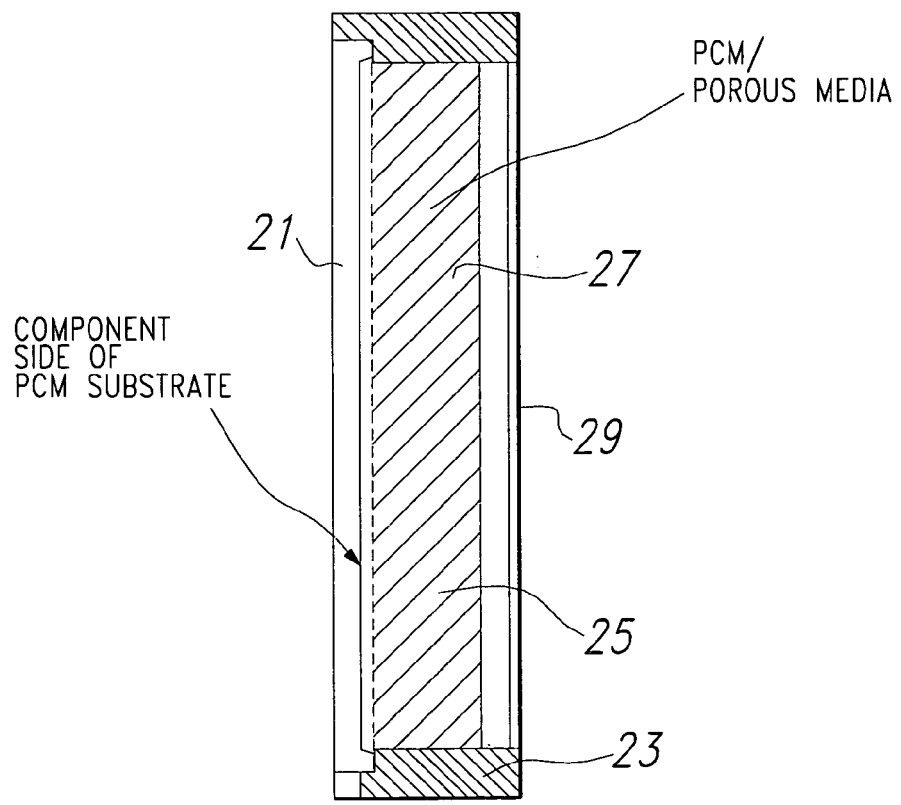

CONSTRUCTION OF PHASE CHANGE MATERIAL EMBEDDED ELECTRONIC CIRCUIT BOARDS AND ELECTRONIC CIRCUIT BOARD ASSEMBLIES USING POROUS AND FIBROUS MEDIA

This application is a Division of application Ser. No. 08/406,226, filed Mar. 17, 1995, now abandonded.

BACKGROUND OF THE INVENTION

1. Field of the Invention

This invention relates to heat sinks and, more specifically, to heat sinks wherein heat is absorbed by the phase change of a phase change material.

2. Brief Description of the Prior Art

For certain applications, electronic circuit board and component heat sinks are built with embedded phase change material (PCM). Phase change materials for such purposes are well known in the art, an example thereof being a wax which preferably has a unitary melting temperature, paraffins of this type being readily available and well known. The PCM absorbs waste heat as it changes from the solid state to the liquid state. PCMs are also available which can further change from the liquid state to the gaseous state or merely operate in the latter two phase states. Currently, heat sinks which use a PCM are built in several ways. One way is to machine thermally conductive fins in a thermally conductive plate, such as, for example, aluminum or copper. PCM is poured into a cavity containing the fins and a lid is used to seal the PCM volume. Heat is drawn to the fins and then from the fins into the PCM with the PCM changing phase as it absorbs the heat. An alternate means of construction is to build a similar assembly using commercially available thermally conductive fin stock. In this alternate configuration, the fin stock is vacuum brazed or dip brazed to a thermally conductive plate.

In both cases, the thermal efficiency of the system is limited by the minimum obtainable feature sizes of machined fins and fin stock since the amount of heat transferred from the fins to the PCM is related to the amount of fin surface contacting the PCM as well as the amount of PCM material available for phase change. The goal is to have the minimum fin thickness and the minimum distance between fins while having the maximum possible volume of PCM in the cavity area. Maximum PCM volume is obtained by having the minimum fin thickness. The minimum distance between fins is required to reduce the thermal resistance between the fin and the PCM melt front. With either machined fins or fin stock, heat from localized sources is transferred directly into the PCM under the heat source and along the fin length to the PCM not located directly under the heat source. Fins essentially provide two dimensional heat flow. This limits the thermal performance of the heat sink.

SUMMARY OF THE INVENTION

In accordance with the present invention, there is provided a heat sink having three dimensional properties and capable of providing improved thermal performance relative to the above described prior art systems.

Briefly, there is provided a highly thermally conductive porous medium to replace the machined fins and fin stock, the porous medium preferably filling the volume containing the PCM. Since porous media have randomly aligned stringers that are all interconnected, the transfer of heat is three dimensional. This improves the transport of heat from localized sources. In addition, the porous medium stringers are very small and surround small pockets of PCM. This feature minimizes the thermal resistance between the heat sink and PCM melt front. Accordingly, the present invention provides a highly thermally conductive porous medium which has a higher percentage of surface area per unit volume available for contact with the PCM than in the prior art and which preferably fills the PCM-containing volume, preferably on a somewhat homogenous basis and as homogeneous a basis as can be provided with a porous medium, as well as filling this volume. The prior art fins do not provide the degree of homogeneity available with the use of the porous media in accordance with the present invention. Homogeneity provides a more efficient PCM heat sink with greater temperature uniformity.

A heat sink in accordance with a first embodiment of the present invention includes a highly thermally conductive porous medium, preferably an aluminum foam of the type sold under the trademark "Duocel" by ERG Materials Division, 900 Stanford Avenue, Oakland, Calif. The porous medium is secured to a highly thermally conductive plate, such as, for example, aluminum, by, for example, vacuum brazing to the plate. The plate is a heat sink mounting surface with a cover or lid and, with the lid, forms a cavity capable of retaining the porous medium therein as well as the PCM in both the solid and liquid state to enclose the porous medium and PCM within the cavity. Once the lid and plate are fabricated and assembled, the porous medium is placed in the cavity and the PCM is melted and poured into the voids of the porous medium as well as part and preferably all of the remainder of the cavity. This results in a PCM filled heat sink to which electronic components can be mounted. The lid is then placed over the plate to provide a sealed cavity within the heat sink containing the porous medium and the PCM material within the cavity. The heat sink can be a stand-alone piece or integrated as part of an electronic circuit board. An integrated approach employs the PCM-filled structure as the substrate upon which circuit layers are built. This basic type of circuit construction is currently in use in conjunction with prior art heat sinks as described hereinabove.

In accordance with a second embodiment of the invention, the plate of the first embodiment is made of a highly thermally conductive composite fiber material in a matrix, such as, for example, graphite fibers in a matrix of preferably an epoxy, preferably AMOCO K1100X. Composite fibers without matrix extend from the plate into the PCM cavity. These fibers are highly heat conductive and perform the same function as the machined fins and fin stock as discussed hereinabove. However, these fibers can also be arranged so that some of the fibers extend out of the matrix and into the cavity to substantially fill the cavity while also being porous as in the case of the first embodiment. With fibers forming a mat of thermally conductive elements or stringers, the same improvements in thermal performance seen with porous foam media are also realized. Both porous foam media and fibrous media enhance the thermal performance of PCM embedded heat sinks. They can either be stand-alone heat sinks or be integrated with the electrical circuit substrate.

BRIEF DESCRIPTION OF THE DRAWINGS

FIG. 1 is a schematic diagram of a heat sink in accordance with a first embodiment of the invention using a porous unitary medium;

FIG. 2 is a schematic diagram of a heat sink in accordance with a second embodiment of the invention using a fibrous plate with fibers from the fibrous plate extending into the PCM cavity to provide the equivalent of a porous medium in the cavity; and FIG. 3 is a cross-sectional view of a heat sink which can use the heat sinking material in accordance with the present invention.

DESCRIPTION OF THE PREFERRED EMBODIMENT

Referring to FIG. 1, porous aluminum medium 1 is vacuum brazed to an aluminum plate 3, which is a heat sink mounting surface, with a cover or lid 5 forming a cavity with the aluminum plate 3 to enclose the porous aluminum medium in the cavity. Heat generators (not shown) are preferably secured to the outer surface of the plate 3 after heat sink fabrication. Once the components of the heat sink are fabricated and assembled, PCM 7 in the form of paraffin is melted and poured into the voids of the porous material 1 and also partially or fully fill the remainder of the cavity. This results in a PCM filled heat sink to which electronic components are mounted. The heat sink can be a stand-alone piece or integrated as part of the electronic circuit board. In an integrated approach, the PCM-filled structure is employed as the substrate upon which circuit layers are built.

Referring to FIG. 2, the plate 11 is fabricated of a composite fiber material, preferably highly thermally conductive graphite in a matrix, preferably an epoxy. A preferred material for plate fabrication is AMOCO K1100X. In this design, composite fibers 13 from the plate 11 without matrix attached extend from the plate into the PCM cavity to provide good thermal contact between the fibers 13 and the plate 11. These fibers 13 are highly thermally conductive and perform the same function as the machined fins and fin stock of the prior art and the porous media of the first embodiment discussed hereinabove. The PCM material 15 is then entered into the cavity as in the first embodiment and the lid 17 and then closed to provide the enclosed cavity. With fibers 13 forming a porous mat of thermally conductive elements or stringers, the same improvements in thermal performance seen with porous media are also realized.

Both porous media and fibrous media enhance the thermal performance of PCM embedded heat sinks. The heat sinks can either be stand-alone heat sinks or be integrated with the electrical circuit substrate.

An example of a PCM substrate/module is shown in FIG. 3. An enclosure is formed using a plate of aluminum 21 secured to a wall member 23 which can be of any material capable of withstanding the conditions to which the module will be subjected, such as a plastic. The porous medium 25 is placed in the cavity formed by the wall 23 and plate 21 and the PCM material 27 in liquid form is then poured into the cavity and the lid 29 is then secured to the wall 23 to enclose the porous medium and PCM material within the cavity. Components, circuit boards or other heat generators are then secured to the plate 21 for extraction of the heat therefrom and conduction of this heat to the PCM material 27 via the porous medium 25.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. An apparatus comprising a heat sink which in its entirety can absorb heat over time, said heat sink including:
   (a) an enclosure defining an enclosed cavity and having a highly thermally conductive portion composed of a composite of highly thermally conductive fibers disposed in a matrix;
   (b) a plurality of said fibers extending externally of said matrix and into said cavity to provide a porous, highly thermally conductive material integral with and thermally coupled to said highly thermally conductive portion and disposed in said cavity, said porous material being said plurality of said thermally conductive fibers extending from said matrix into said cavity, and
   (c) a phase change material disposed in said porous material in said cavity, said phase change material being operable in its entirety to absorb heat over time, and said phase change material changing from an initial phase to a final phase in response to the absorption of heat.

2. The apparatus of claim 1 wherein said phase change material is a wax.

3. The apparatus of claim 1 wherein said thermally conductive fibers are graphite.

4. The apparatus of claim 1 wherein said porous material is substantially homogeneously disposed within said cavity.

5. The apparatus of claim 4 wherein said thermally conductive fibers are graphite.

6. The apparatus of claim 1 wherein said initial phase of said phase change material is a solid phase and said final phase is a liquid phase.

7. The apparatus of claim 6 wherein said phase change material is a wax.

8. The apparatus of claim 6 wherein said thermally conductive fibers are graphite.

9. The apparatus of claim 6 wherein said porous material is substantially homogeneously disposed within said cavity.

10. The apparatus of claim 9 wherein said thermally conductive fibers are graphite.

11. An apparatus comprising a heat sink which in its entirety is operable to effect over a period of time a net absorption of heat from externally thereof, said heat sink including:
   an enclosure having a cavity therein, said enclosure having a highly thermally conductive portion;
   a highly thermally conductive porous material disposed within said cavity and coupled physically and thermally to said highly thermally conductive portion of said enclosure, said porous material having voids therein; and
   a phase change material provided within said cavity so as to be disposed within and substantially fill said voids in said porous material, said phase change material being operable in its entirety over a period of time to effect a net absorption of heat introduced thereinto through said highly conductive portion and said porous material, said phase change material changing in its entirety from a solid phase to a liquid phase in response to said absorption of heat by said phase change material.

12. The apparatus of claim 11, wherein said phase change material is free of substantial movement within said cavity.

13. The apparatus of claim 11, wherein said porous material includes a plurality of highly thermally conductive fibers.

14. The apparatus of claim 11, wherein said portion of said enclosure includes a composite of highly thermally conductive fibers which are disposed in a matrix and which have portions extending from said matrix into said cavity, said porous material including said portions of said fibers.

15. The apparatus of claim 11, wherein said portion of said enclosure is made of a metal, and wherein said porous material is made of a metal and is brazed to said portion of said enclosure.

16. A method of operating a heat sink so that, over a period of time, said heat sink will in its entirety experience a net absorption of heat from externally thereof, said heat sink including an enclosure with a highly thermally conductive portion, a highly thermally conductive porous material which has voids therein, which is disposed within a cavity in said enclosure and which is coupled physically and thermally to said highly thermally conductive portion of said enclosure, and a phase change material which is provided within said cavity so as to be disposed within and substantially fill said voids in said porous material, said method including the steps of:

applying heat to said highly thermally conductive portion of said enclosure from externally of said enclosure;

transmitting heat through said highly thermally conductive portion of said enclosure and through said porous material to said phase change material;

causing said phase change material in its entirety to effect, over a period of time, a net absorption of heat introduced thereinto through said highly thermally conductive portion of said enclosure and said porous material; and causing said phase change material to change in its entirety from a solid phase to a liquid phase in response to said absorption of heat by said phase change material.

17. The method of claim 16, including the step of causing said phase change material to be substantially free of movement within said cavity.

* * * * *